(12) United States Patent
Nguyen

(10) Patent No.: US 6,414,326 B1
(45) Date of Patent: Jul. 2, 2002

(54) TECHNIQUE TO SEPARATE DOSE-INDUCED VS. FOCUS-INDUCED CD OR LINEWIDTH VARIATION

(75) Inventor: Khanh B. Nguyen, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/386,980

(22) Filed: Aug. 31, 1999

(51) Int. Cl.$^7$ .............................................. G02B 27/14
(52) U.S. Cl. ...................... 250/492.2; 359/637; 355/53
(58) Field of Search ........................ 250/492.2, 492.22, 250/492.3, 491.1, 310, 306, 307, 548; 359/637, 622; 355/53, 67; 430/30

(56) References Cited

U.S. PATENT DOCUMENTS 6,208,469 B1 * 3/2001 Matsuura ..................... 359/637

OTHER PUBLICATIONS

"Pattern transfer at $k_1$ =0.5: Get 0.25 μm lithography ready for manufacturing", by Wilhelm Maurer, Kimihiro Satoh, Don Samuels and Thomas Fischer, SPIE, vol. 2726, 12 pages.

"Lithography I: Optical Photoresist Materials and Process Technology", Silicon Processing For The VLSI Era, pp. 407–409.

"Lithography II: Optical Aligners and Photomasks", Silicon Processing For The VLSI Era, pp. 459–489.

* cited by examiner

*Primary Examiner*—Kiet T. Nguyen
(74) *Attorney, Agent, or Firm*—Eschweiler & Associates, LLC

(57) ABSTRACT

A method of identifying a change in focus and a change in illumination from a best focus and a best dose at a region on a substrate corresponding to a point in the image field of a lithographic printing tool is disclosed. The method includes forming a feature having a first pitch and a feature having a second pitch at the region on the substrate, and identifying a linewidth of the features. The identified linewidths are then used to determine the change in focus from the best focus and the change in dose from the best dose which would produce both the first pitch feature and the second pitch feature at the region.

22 Claims, 13 Drawing Sheets

$L_1 \neq L_2$

TECHNIQUE TO SEPARATE DOSE-INDUCED VS. FOCUS-INDUCED CD OR LINEWIDTH VARIATION

FIELD OF THE INVENTION

The present invention generally relates to optical aligner lithography tools and methods for using such tools, and more particularly relates to a method for separating dose-induced from focus-induced critical dimension or linewidth variations of features across an image field in a lithographic printing process.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIGS. 1a–1f.

Prior art FIG. 1a illustrates a photoresist layer 10 deposited by, for example, spin-coating, on a thin film 11 such as, for example, silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

The exposed regions 16 are made either soluble or insoluble in the developer. When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist". In a similar manner, the exposed underlying areas 20 in the film 11 may then be subjected to further processing (e.g., etching) to thereby transfer the desired pattern from the mask 14 to the film 11, as illustrated in prior art FIG. 1f.

The transfer of patterns to the photoresist layer 10 as discussed above involves the use of optical aligners. Optical aligners are machines which contain a variety of subsystems that work together to form the imaging function. Such optical aligners include: (1) an illumination source which provides the optical energy (UV light in the above example) for transforming the photoresist via exposure, (2) an optical subsystem that focuses the circuit patterns onto the photoresist surface and allows for controlled exposure times, and (3) and a movable stage that holds the wafer being exposed.

Historically, three primary methods have been used to optically transfer a mask pattern to a photoresist covered film. These methods are: contact printing, proximity printing and projection printing and are illustrated in simplified form in prior art FIGS. 2a–2d, respectively. Contact printing 100, as illustrated in prior art FIG. 2a, was the earliest method used to produce patterns. Contact printing 100 involves a light source 112, an optical system 114, a mask 116 and a photoresist layer 118 overlying a thin film 119 (not shown) which, in turn, overlies a semiconductor wafer 120. The mask 116, which contains the desired circuit patterns for transfer to the photoresist layer 118, is positioned (aligned) relative to any existing patterns that already existed on the wafer 120. The mask 116 is then clamped down to the photoresist layer 118, thereby making physical contact with the photoresist layer 118, and exposed with ultraviolet (UV) light from the light source 112. This method provides for an excellent image transfer and good resolution (i.e., good minimum linewidth spacing).

Contact printing, however, suffers from the direct contact made between the mask 116 and the photoresist layer 118. The repeated contact made between the mask 116 and the photoresist layer 118 in the process results in defects generated in the mask 116 which are then reflected in the transfer made on subsequently processed wafers. To prevent this problem, the masks 116 must disadvantageously be inspected and cleaned regularly. In addition, small particles may be caught between the mask 116 and the photoresist layer 118 when affixing the two elements, thereby preventing the desired direct contact between the mask 116 and the photoresist layer 118. This particulate contamination results in reduced resolution in the area local to the foreign particle. Consequently, contact printing is not common in VLSI semiconductor manufacturing.

Proximity printing 122, as illustrated in prior art FIG. 2b, involves placing the mask 116 near the wafer 120 (which is covered with the photoresist 118) during exposure, however, the mask 116 and the wafer 120 do not make contact. By introducing a gap 124 between the mask 116 and the wafer 120, the defect problem of contact printing is substantially avoided. Unfortunately, as the gap 124 increases, the resolution of the proximity printing system 122 rapidly deteriorates. For example, a 10 $\mu$m gap with a 400 nm exposure (the wavelength of the light source 112) results in a minimum resolution of about 3 $\mu$m. In addition, proximity printing 122 requires extremely flat masks 116 and wafers 120 in order to prevent gap variations spatially about the wafer 120. Since many VLSI semiconductor circuits today require features of 0.25 $\mu$m or less, proximity printing 122 is not considered adequate for many VLSI semiconductor manufacturing operations.

Projection printing is a generic term that encompasses various pattern transfer techniques. These techniques, for example, include: (a) projection scanning systems, (b) reduction (e.g., 4× or 10×) step-and-repeat projection systems and (c) reduction step-and-scan systems. In each system, lens elements or mirrors are used to focus the mask image on the wafer surface (containing the photoresist).

Projection scanning systems (often called scanning projection aligners), use a reflective spherical mirror (reflective optics) to project an image onto the wafer surface, as illustrated, for example, in prior art FIG. 2c. The system 126 includes a primary mirror 128 and a secondary mirror 129 which are arranged with the mask 116 and the wafer 120 to image the mask pattern onto the photoresist layer 118 which overlies the film 119 on the wafer 120 (the photoresist layer 118 and the thin film 119 are not shown in FIG. 2c for simplicity). A narrow arc of radiation is imaged from the mask 116 to the wafer 120 with light that travels an optical path that reflects the light multiple times. The mask 116 and the wafer 120 are scanned through the arc of radiation by means of a continuous scanning mechanism (not shown). The scanning technique minimizes mirror distortions and aberrations by keeping the imaging illumination in the "sweet spot" of the imaging system 128 and 129.

Reduction step-and-repeat systems 130 (also called reduction steppers) use refractive optics (as opposed to reflective optics in the system 126 of prior art FIG. 2c) to project the mask image onto the photoresist layer 118 which overlies the film 119 on the wafer 120, as illustrated, for example, in prior art FIG. 2d. The reduction stepper 130 includes a mirror 132, a light source 134, a filter 136, a condenser lens system 138, a reticle 140, a reduction lens system 142 and the wafer 120. The mirror 132 behaves as a collecting optics system to direct as much of the light from the light source 134 (e.g., a mercury-vapor lamp) to the wafer 120. The filter 136 is used to limit the light exposure wavelengths to the specified frequencies and bandwidth. The condenser system 138 focuses the radiation through the reticle 140 and to the reduction lens system to thereby focus a "masked" radiation exposure onto a limited portion of the wafer 120, namely onto a single semiconductor die 144.

Since it is complex and expensive to produce a lens capable of projecting a mask pattern of an entire 150 mm or 200 mm wafer, the refractive system 130, as illustrated in prior art FIG. 2d, projects an image only onto a portion of the wafer 120 corresponding to one or more semiconductor die 144. This image is then stepped and repeated across the wafer 120 in order to transfer the pattern to the entire wafer (and thus the name "steppers"). Consequently, the size of the wafer is no longer a consideration for the system optics.

The reduction stepper system 130 thus uses the reticle 140 instead of a mask. Reticles are similar to masks, but differ in that a mask contains a pattern for transfer to the entire wafer in one exposure while a reticle contains a pattern image for a single or several semiconductor die that must be stepped and repeated across the wafer 120 in order to expose the entire wafer substrate. Although such a distinction has historically been made between a mask and a reticle, such distinctions are not currently made and such terms are used interchangeably and will be so used herein. Current reduction stepper systems such as the system 130 utilize reticles that contain a pattern that is an enlargement of the desired image on the wafer 120. Consequently, the reticle pattern is reduced when projected onto the wafer 120 during exposure (and thus the name "reduction stepper").

One advantage of stepper technology over the full wafer scanning type technology is higher image resolution (i.e., smaller minimum feature linewidths). In addition, stepping each die on the wafer 20 allows compensation for wafer distortion. Further still, reduction steppers provide good overlay accuracy. Steppers do, however, exhibit reduced throughput (number of wafers/hour) and require precision control of the mechanical stage (not shown) which holds the wafer 120. The advantages of reduction steppers, however, presently outweigh their disadvantages and thereby make reduction steppers quite popular in the manufacture of VLSI semiconductors with minimum linewidths less than 1 μm.

Although the above systems exhibit improved performance over prior art lithography systems, there is a continuing need and desire in the art to print features (i.e., structures) with increasingly smaller linewidths or critical dimensions. Furthermore, as such features continue to decrease toward 0.1 μm and smaller, linewidth uniformity across the substrate or wafer, from wafer-to-wafer, from lot-to-lot and/or over time becomes more important so that designers who employ such structures are assured of uniform, predictable performance from die-to-die across a wafer, from wafer-to-wafer, lot-to-lot, etc. Therefore there is a need in the art for a method of improving performance in lithographic printing processes.

SUMMARY OF THE INVENTION

The present invention relates to a method of evaluating linewidth variations of features generated by a lithographic printing process across a wafer, from wafer-to-wafer, lot-to-lot and over time. Such linewidth variations are attributable to a variety of different factors, wherein variations due to the illumination dose and the focus are significant contributors. The present invention provides for the separation of dose-induced linewidth variations from focus-induced linewidth variations to thereby enable lithography process designers to identify the extent to which each factor is contributing to the feature linewidth variations. Distilling such contributions from one another allows process developers to identify the impact of process changes on each factor separately, thereby facilitating the lithography design development process.

According to the present invention, dose-induced linewidth variations are distilled from focus-induced linewidth variations by forming isolated and non-isolated structures or features, respectively, at multiple regions on a substrate which correspond to the same points in the image field as the tool steps across the wafer. The linewidths of the isolated and non-isolated structures or features are then measured at each of the points across the wafer. The linewidths of the isolated and non-isolated structures corresponding to the same point in the image field are then used to distill the variations due to focus variations from those due to changes in illumination dose between the various points.

The use of the linewidths of isolated and non-isolated structures to identify the extent to which linewidth variations are attributable to focus variations as opposed to changes in illumination dose stems from a realization and appreciation by the inventor of the present invention that differences in the linewidth changes of such structures (e.g. the ISO/DENSE bias) occur when the focus varies while variations in the illumination dose have substantially no impact thereon. It was appreciated by the inventor that this principle or phenomena may be utilized to separate the focus-induced variations from the dose-induced variations. Therefore the present invention contemplates generating isolated and non-isolated (i.e., dense) structures or features at various regions across the wafer corresponding to the same point or points in the image field as the lithographic printing tool is stepped across the wafer and to other wafers, lots, etc. The linewidths of the isolated and non-isolated structures are measured and then used to identify the extent to which measured linewidth variations between corresponding points are caused by variations in focus or dose.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
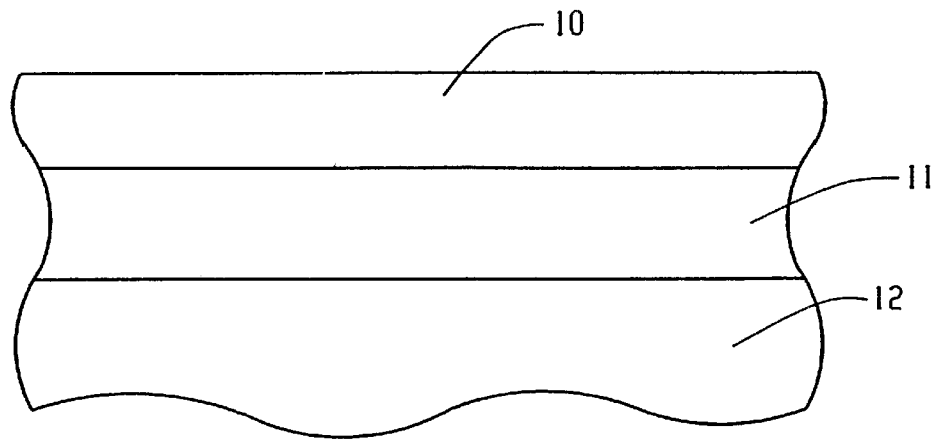
FIG. 1a is a fragmentary cross section illustrating a prior art semiconductor substrate having a film overlying the substrate which in turn is covered by a photoresist layer.
Figure 1B:
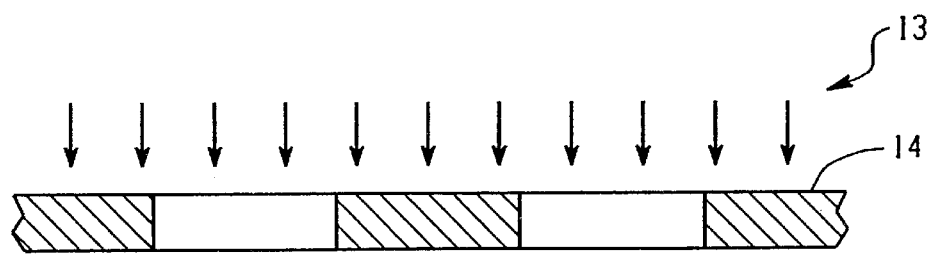
FIG. 1b is a fragmentary cross section illustrating a prior art method of selectively exposing a photoresist layer using a mask.
Figure 1B:
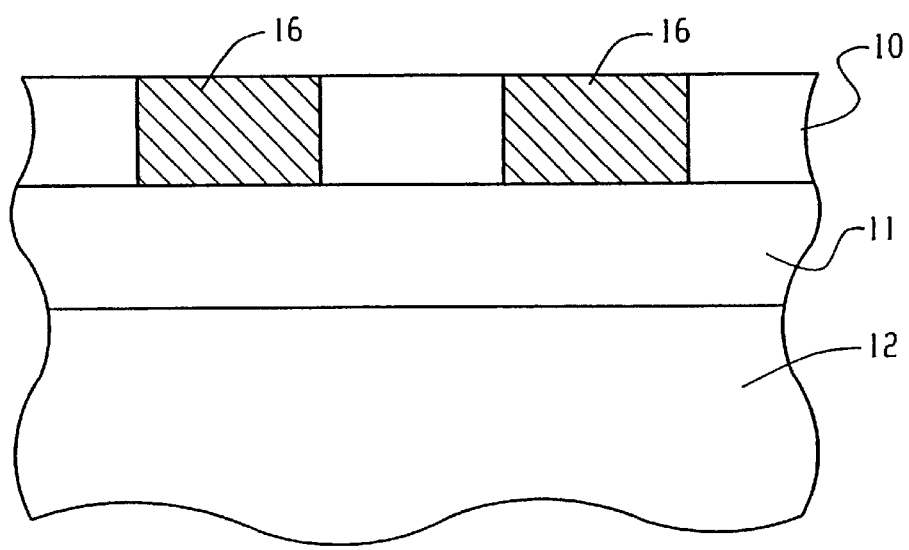
Figure 1C:
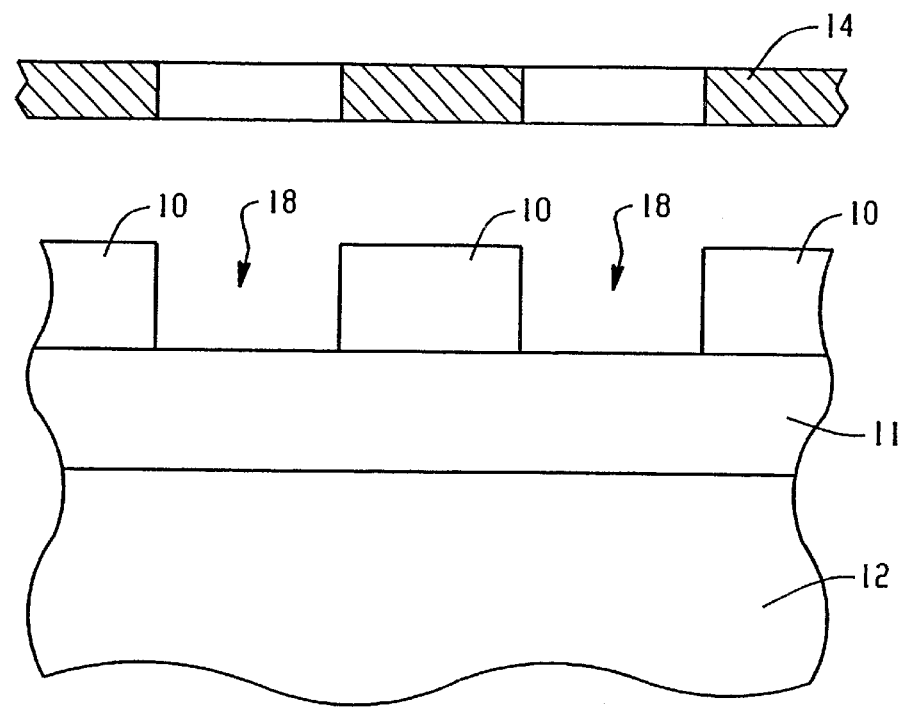
FIG. 1c is a fragmentary cross section illustrating a positive photoresist layer after being developed.
Figure 1D:
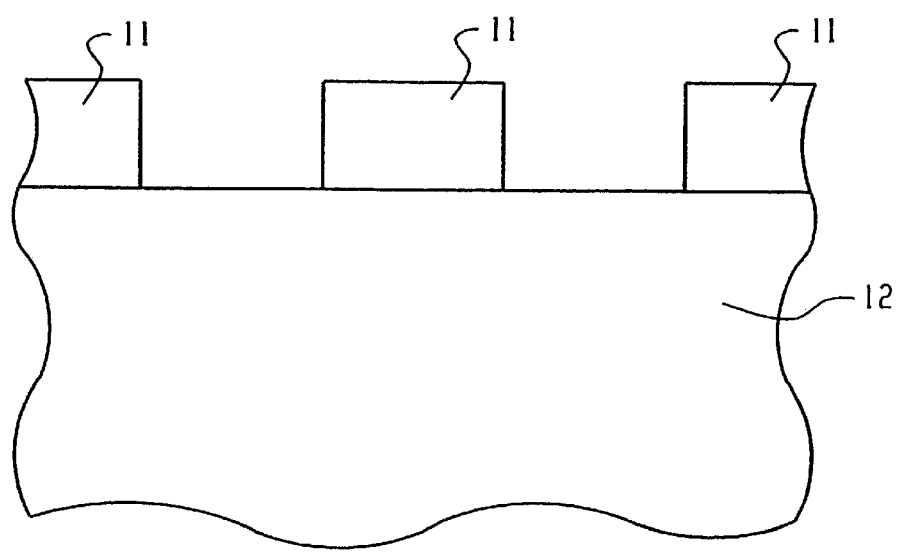
FIG. 1d is a fragmentary cross section illustrating a transfer of a mask pattern to the film.
Figure 1E:
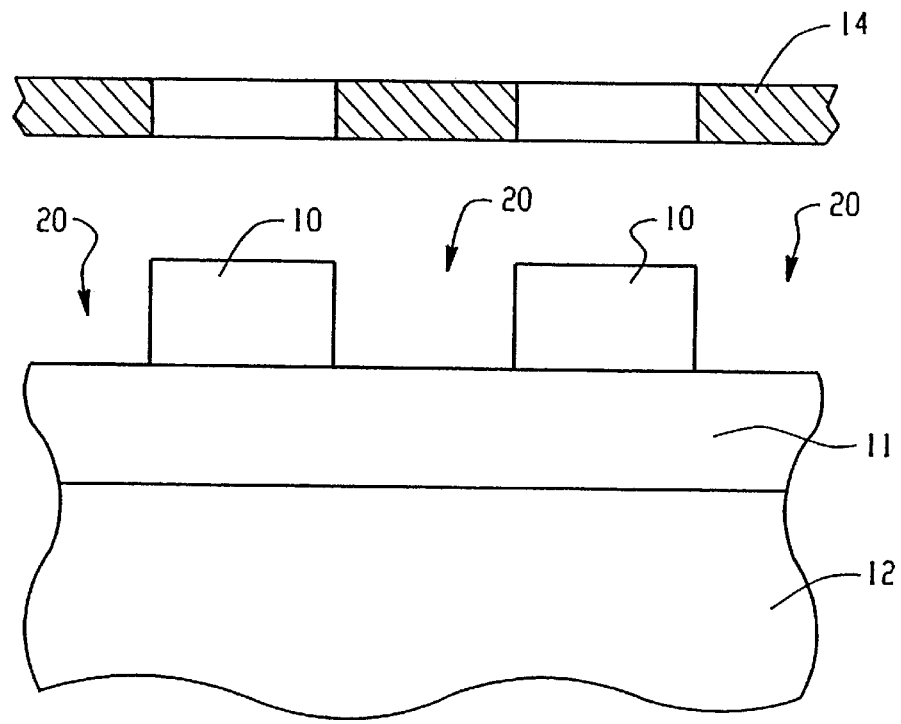
FIG. 1e is a fragmentary cross section illustrating a negative photoresist layer after being developed.
Figure 1F:
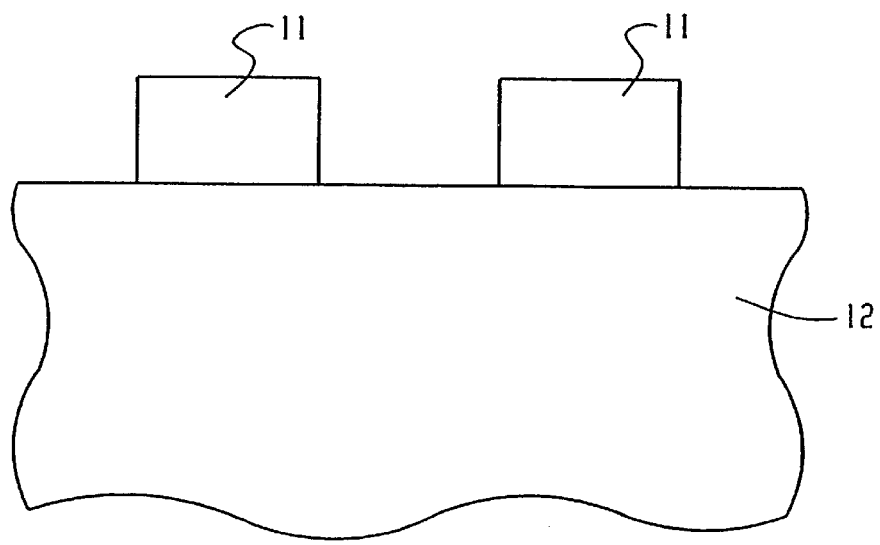
FIG. 1f is a fragmentary cross section illustrating a transfer of a mask pattern to the film.
Figure 2A:
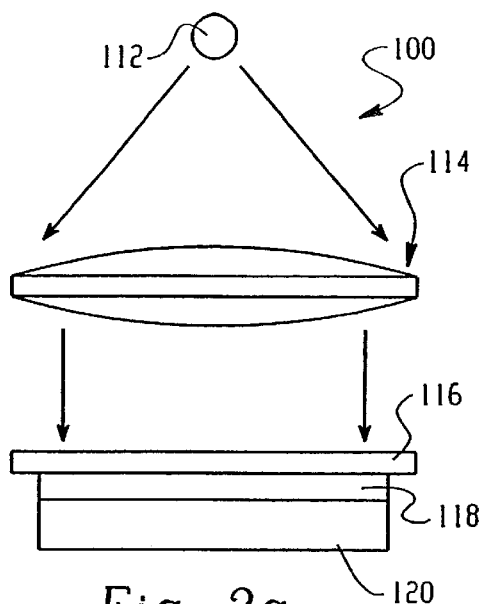
FIG. 2a is system view of a prior art contact printing system wherein a mask physically contacts the wafer during transfer of a pattern to the wafer.
Figure 2B:
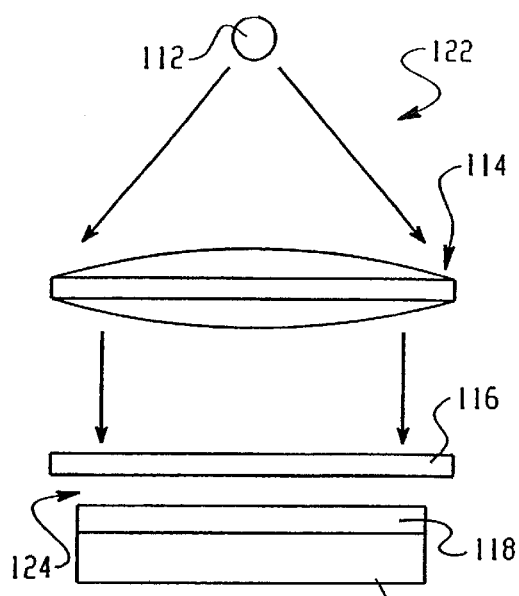
FIG. 2b is a system view of a prior art proximity printing system wherein a mask is separated from the underlying wafer by a gap during transfer of a pattern to the wafer.
Figure 2C:
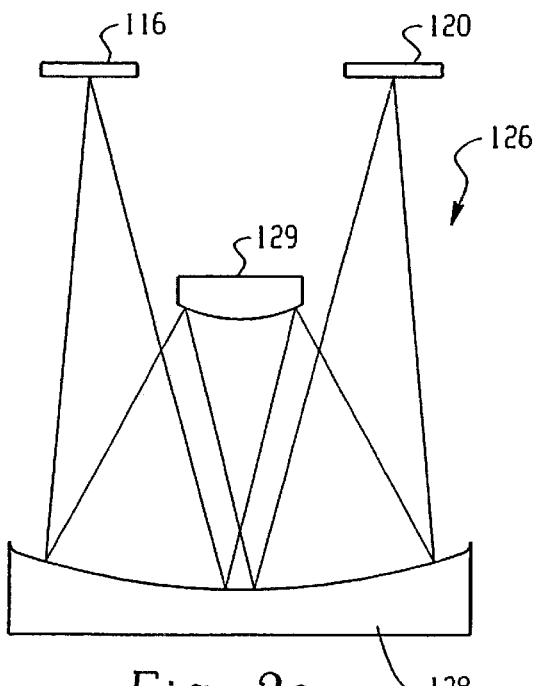
FIG. 2c is a system view of a prior art scanning projection system wherein reflective optics are used to transfer a pattern to the wafer.
Figure 2D:
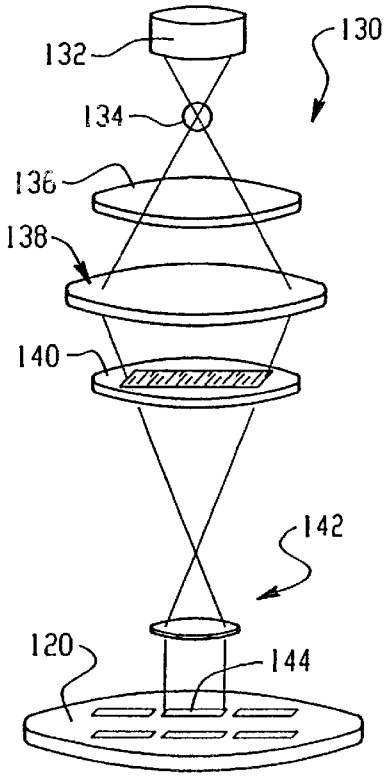
FIG. 2d is a system view of a prior art reduction stepper wherein refractive optics are used to transfer a pattern to a localized region on the wafer.

The following is a detailed description of the present invention made in conjunction with the attached Figures, wherein like reference numerals will refer to like elements throughout. The present invention includes a method of separating linewidth variations which are due to focus variations in the lithographic printing tool from linewidth variations which are due to variations in the illumination dose as a lithographic printing tool steps across the wafer (as well as variations from wafer-to-wafer, lot-to-lot, etc.). Distilling the individual contributions of the linewidth variation from one another advantageously allows lithography process designers to monitor each factor individually to identify the impact of various lithography process changes on the individual variation components, thereby facilitating lithography process design for use in integrated circuit processing and other lithography applications.

It is a constant objective of integrated circuit designers to make individual devices smaller, for example, in order to improve the packing density of the integrated circuit, thus allowing a given circuit design to be manufactured less expensively, or alternatively, to enhance the functionality and/or performance of the device. As integrated circuits continue to shrink, each feature which makes up such devices is targeted for size reduction and feature variations therefore impact the performance of devices employing such features. Accordingly, the uniformity at which such features are produced across the wafer, from wafer-to-wafer, lot-to-lot and over time becomes a significant process concern.

Figure 3A:
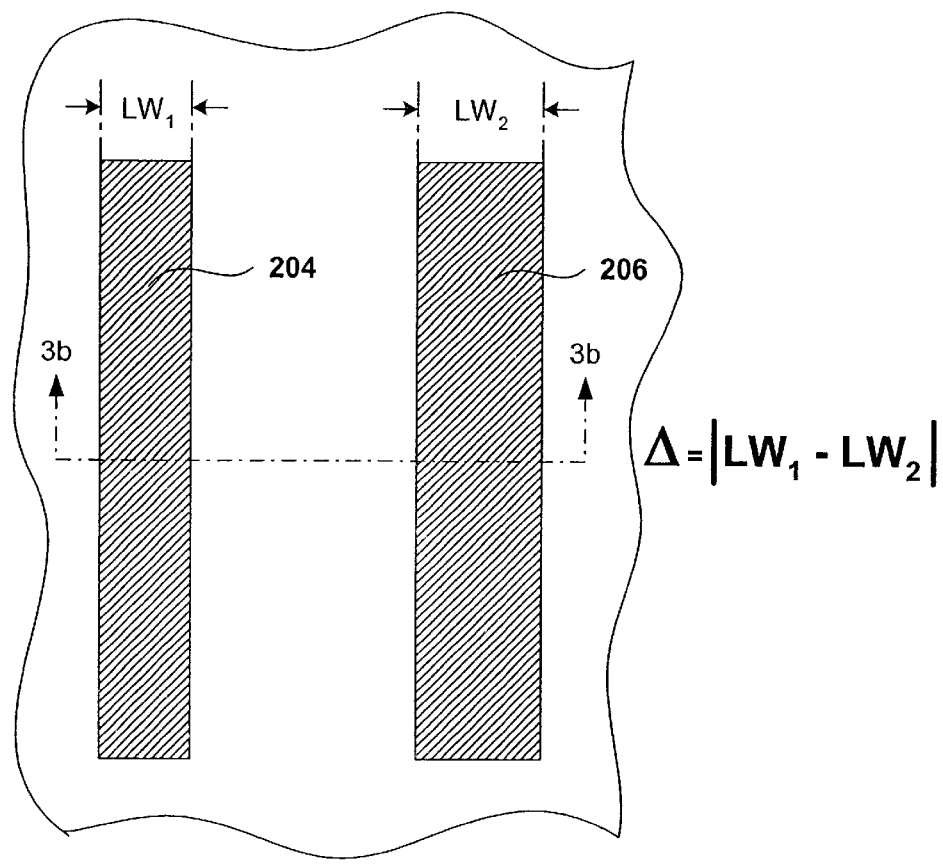
FIG. 3a is a plan view of two features on a substrate, wherein the two features have linewidths which differ from one another.
Figure 3B:
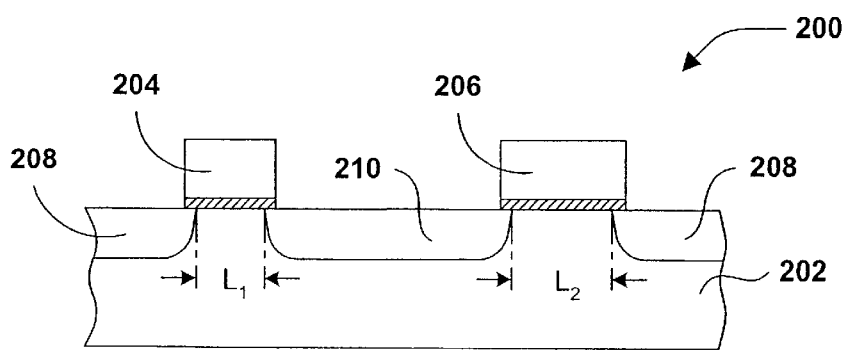
FIG. 3b is a cross section view taken along lines 3b—3b of FIG. 3a illustrating an exemplary impact of the linewidth variation between the two features on resultant device performance.

One example to illustrate the importance of feature uniformity or feature dimension control is illustrated in FIGS. 3a and 3b. In FIG. 3a, a portion 200 of a substrate 202 is illustrated, having two features 204 and 206 formed thereon which correspond to polysilicon gates. (Note that the poly gates are not connected to other circuitry in FIG. 3a for ease of illustration purposes.) Each feature 204 and 206 has a linewidth $LW_1$, and $LW_2$ associated therewith which is typically not exactly the same. That is, a difference in the linewidth dimension exists between the features 204 and 206 which can be expressed as follows:

$$\Delta |LW_1 - LW_2|.$$

The impact of a variation in the linewidth between the features 204 and 206 is illustrated in FIG. 3b, which is a cross section of FIG. 3a taken along dotted line 3b—3b. The poly gates formed by the features 204 and 206 are typically used to self-align the source/drain regions 208, 210 which are formed, for example, in a subsequent ion implantation step. Since the features 204 and 206 self-align the source/drain regions 208, 210, they also define the channel lengths $L_1$ and $L_2$ of the transistors, which is a significant parameter in determining transistor device performance. For example, the drain current of an enhancement type device in saturation may be given by:

$$I_D = (\mu_n C_{OX}/2)(W/L)(V_{GS} - V_t)^2,$$

wherein (W/L) is the width-to-length ratio of the transistor. Because the features 204 and 206 vary (i.e., $\Delta \neq 0$), the channel lengths $L_1$ and $L_2$ also vary (i.e., $L_1 \neq L_2$), thus making the performance of the transistors different from one another. Therefore variations in the linewidth of features which are intended to be identical disadvantageously create uncertainty regarding the uniformity and/or predictability of performance in various transistors or other components which are formed by the lithographic printing tool. Such nonuniformity in device performance can lead to problems, for example, in the timing performance of the transistors, as well as other problems.

The present invention helps the lithography process designer improve the lithographic printing process by allowing the designer to identify the extent to which the identified linewidth variations at a given point in the image field across the wafer are attributable to focus variations or dose variations. Using such information, for example, the designer can perform a pareto analysis and focus further process development on the factor which is the biggest contributor to the linewidth variations across the image field. In addition, separating each contribution from the other advantageously allows the designer to identify the impact of process developments on each individual factor.

The inventor of the present invention discovered that a lithographic property or phenomena may be manipulated and utilized to distill focus-induced linewidth variations from dose-induced linewidth variations. The lithographic property relates to the manner in which the linewidth of structures or features having different pitches vary with respect to focus and illumination dose. The pitch of a structure or feature relates to the ratio between the size of the feature and the spacing or distance between it and a neighboring feature. For example, a structure having a 1:1 pitch has a linewidth of "X" and a distance between the feature and a neighboring feature is also "X". Furthermore, a feature having a pitch of 5:1 has a linewidth of size "X" and a distance between the feature and a neighboring feature is "5x" (i.e., the spacing ratio is larger).

Figure 4:
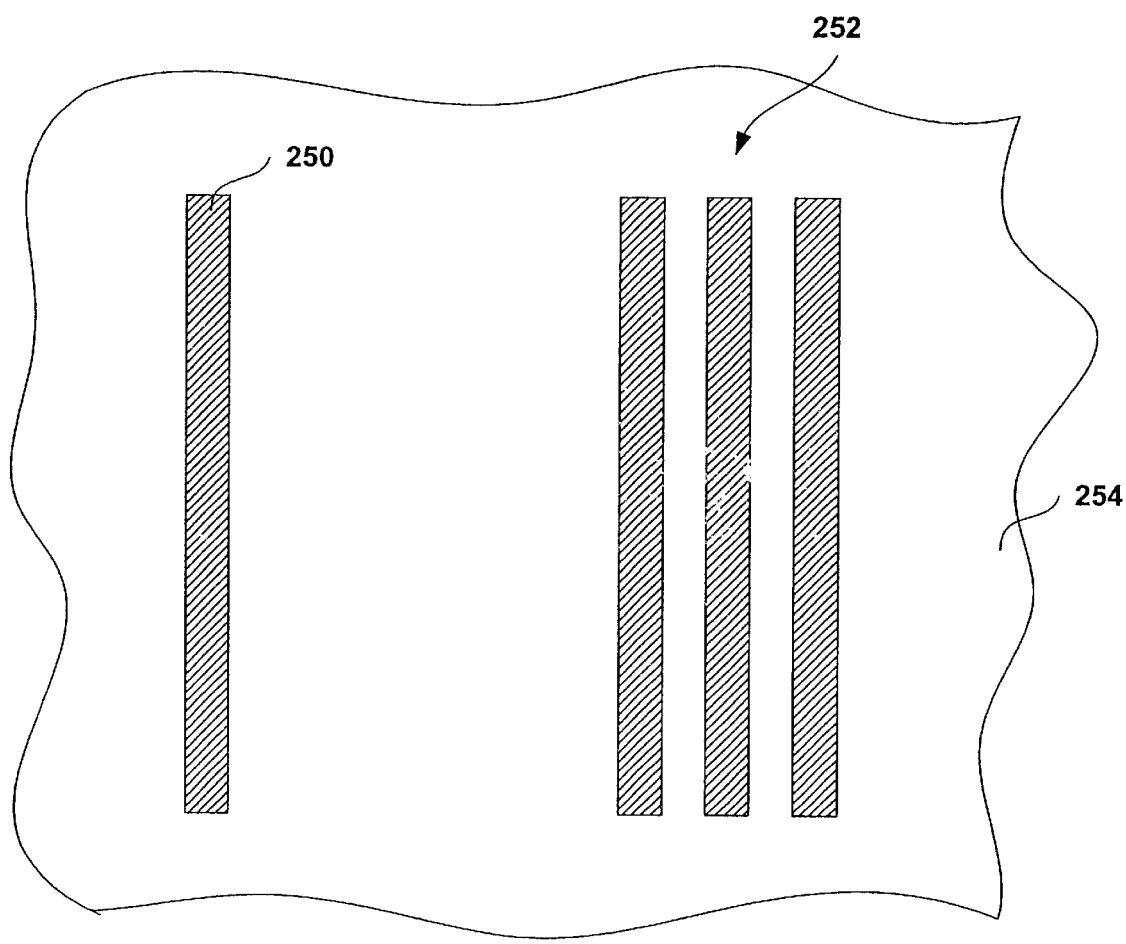
FIG. 4 is a plan view of a plurality of features formed on a substrate, wherein a first feature is substantially isolated and another feature is substantially non-isolated or dense.

Depending on a feature's pitch, the linewidth of the feature will vary differently with respect to variations in focus. For example, FIG. 4 illustrates a first feature 250 which is an isolated feature and a second feature 252 which is a dense or non-isolated feature on a substrate 254. Whether a feature is isolated or dense refers to its pitch or its spacing between itself and a neighboring feature. According to the present invention, an isolated feature is a feature whose pitch or distance between itself and another feature is sufficiently large so that the presence of the neighboring feature has substantially no impact on the processing of the feature of interest. That is, the distance between the feature of interest and the neighboring feature is sufficiently large so that any interference phenomena, etc. which may occur due to the neighboring feature is sufficiently attenuated so that the impact of the presence of the neighboring feature on the processing of the feature of interest is negligible. Typically, a feature is considered to be isolated if its pitch is greater than about 5× the maximum resolution of the optical system. Similarly, a dense feature is a feature having a pitch which results in neighboring features having a non-negligible impact on the processing of the feature of interest. Consequently, in the broadest sense, any feature which is not an isolated feature is a dense or non-isolated feature. As illustrated in FIG. 4, the exemplary dense feature 252 has a pitch of 1:1. Note that although an isolated and non-isolated feature are used as an example to illustrate the manner in which the linewidths of features having different pitches vary uniquely over variations in focus, it should be understood that any features having different pitches will uniquely vary of focus.

Figure 5:
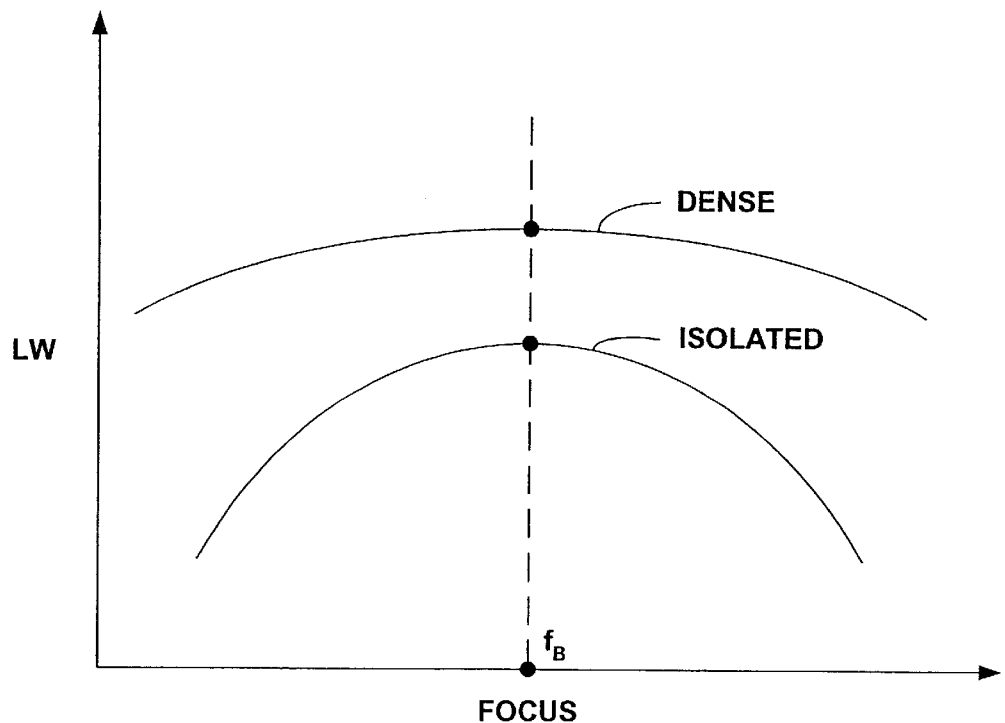
FIG. 5 is a graph illustrating how the linewidth of a feature varies over focus depending on whether the feature is a substantially isolated feature or a substantially non-isolated feature, respectively.
Figure 6:
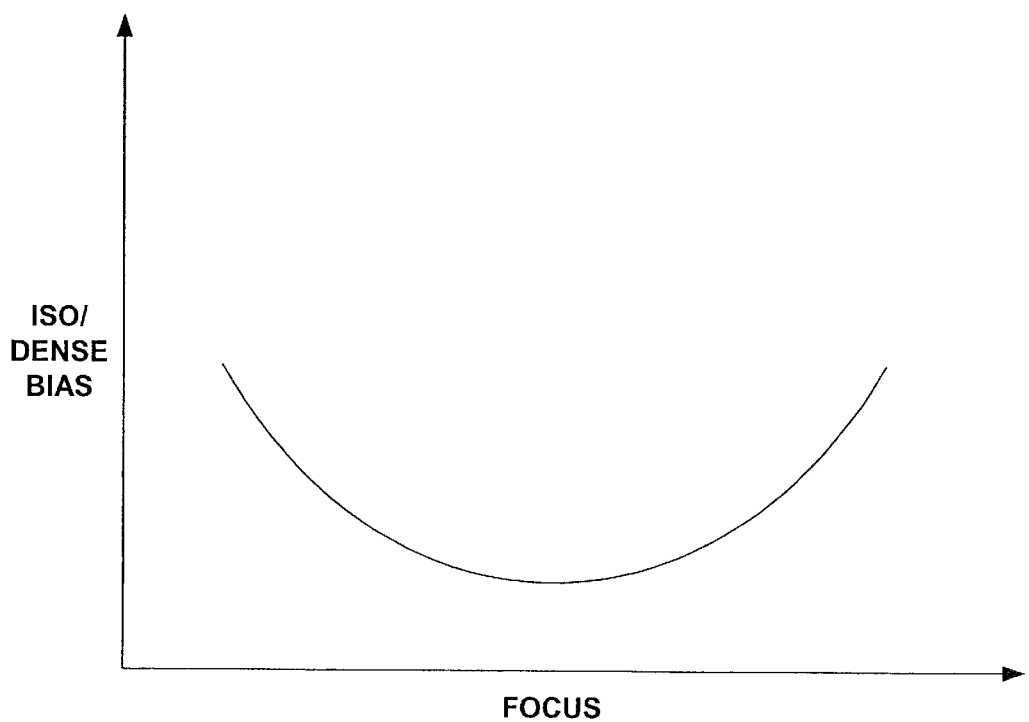
FIG. 6 is a graph illustrating how an ISO/DENSE bias varies over focus.

The present invention utilizes the lithographic property that the linewidth of structures or features having different pitch vary in different ways due to variations in focus across the image field of a lithographic printing tool, while remaining generally constant with respect to variations in illumination dose. This principle is illustrated in FIGS. 5 and 6, respectively. FIG. 5 is a graph which illustrates the change or variation in linewidth of a feature over focus for both isolated features and dense features. Note that for isolated features such as the feature 250 of FIG. 4, the change in linewidth over focus is significant while for dense features such as the feature 252 of FIG. 4, the change in linewidth over focus is significantly less. Using this property, a parameter may be defined as the difference in linewidth between an isolated feature and a dense feature over focus, which is called the ISO/DENSE bias. A graph of the ISO/DENSE bias over focus is illustrated in FIG. 6, wherein the ISO/DENSE bias is the isolated linewidth subtracted from the dense linewidth for each point in the graph of FIG. 5. Again, please note that although an ISO/DENSE bias is used in conjunction with an exemplary embodiment, any features having differing pitches may be used and a differing pitch bias will reflect the nature in which their linewidths vary uniquely over changes in focus.

As can be seen from FIG. 6, the ISO/DENSE bias varies significantly with respect to variations in focus. In stark contrast, however, the ISO/DENSE bias is relatively constant with respect to variations in illumination dose. The inventor of the present invention appreciated that the above properties may be utilized to distill focus-induced linewidth variations from dose-induced linewidth variations in the following manner, which constitutes a preferred embodiment of the present invention.

Figure 7A:
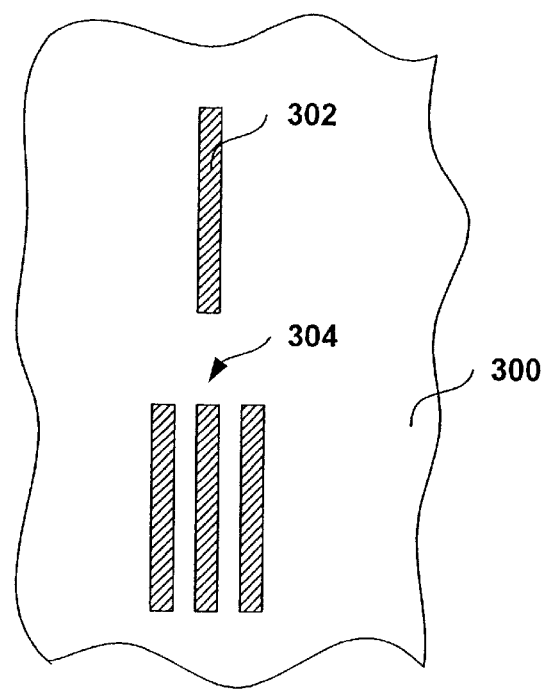
FIG. 7a is a plan view of a region within the image field of a lithographic printing tool having an isolated feature and a dense feature thereat according to the present invention.

In accordance with the present invention, one or more isolated features and one or more dense features are formed at a plurality of locations or regions on a substrate corresponding to a particular point $(X_1, Y_1)$ in the image field using a lithographic printing tool. (Alternatively, and more generally, any features having differing pitches may be employed.) One exemplary set of features is illustrated in FIG. 7a, which represents a region 300 generally corresponding to a single point $(X_1, Y_1)$ in the image field of the lithographic printing tool. The region 300 contains an isolated feature 302 and a non-isolated or dense feature 304 thereon. Although the features preferably consist of rectangles as shown for ease of analysis, it should be appreciated that any type or shape of feature may be used and is contemplated as falling within the scope of the present invention. Similarly, although the dense feature 304 is illustrated in FIG. 7a as a feature having a 1:1 pitch, it should be appreciated that any feature which is non-isolated may be utilized and is contemplated as falling within the scope of the present invention.

The linewidths of the isolated feature 302 and the dense feature 304 at the region 300 are then measured. Such linewidth measurements can be made according to any one of various techniques, for example, an electrical linewidth measurement (ELM), a scanning electron microscope (SEM), etc.

Figure 7B:
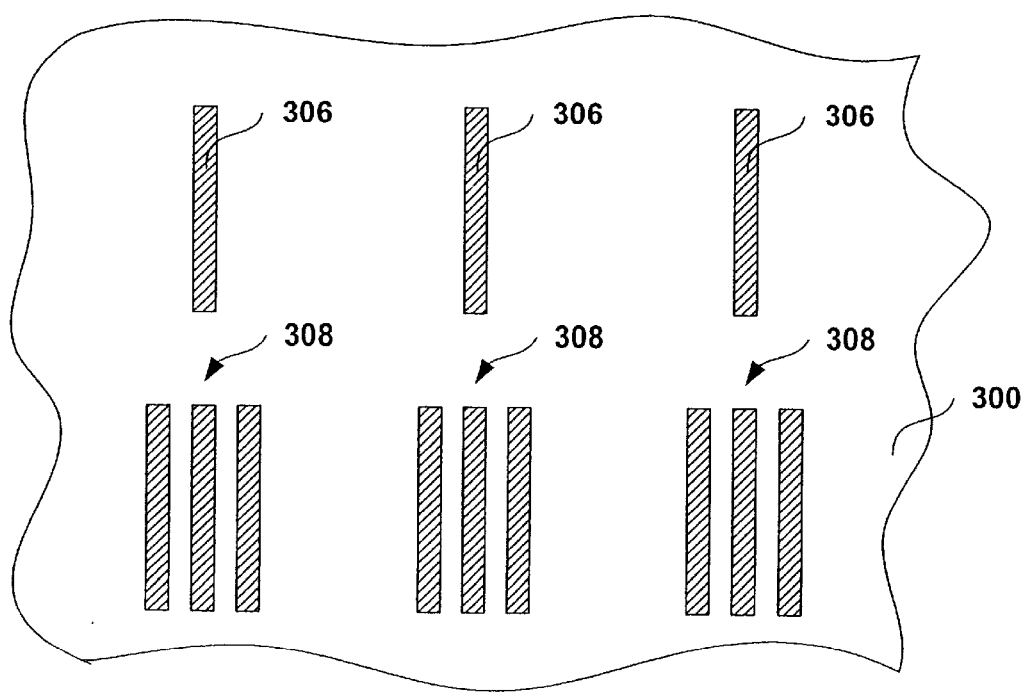
FIG. 7b is a plan view of a region within the image field of the lithographic printing tool having a plurality of isolated features and a plurality of dense features thereat according to the present invention.

FIG. 7a illustrates a single isolated feature 302 and one set of features for the dense feature 304, respectively. Alternatively, as illustrated in FIG. 7b, a plurality of isolated features 306 and a plurality of dense features 308 may be formed at the region 300 corresponding to a point in the image field. In this manner, each of the isolated features 306 and dense features 308 can be measured and an average taken thereof (or alternatively, aberrant data points may be eliminated or massaged via various statistical techniques). In this manner, any variations within the region 300 caused by other factors which are not of interest are substantially eliminated.

The structures or features of FIGS. 7a and 7b are preferably formed at a plurality of regions $(X_1, Y_1; X_2, Y_2; \ldots X_n, Y_n)$, wherein each region generally corresponds to a different point in the image field of the lithographic printing tool. These structures (isolated and non-isolated) are then formed repeatedly at the same points within the image field as the lithography tool steps across the wafer and/or steps to other wafers in the same lot (or from lot-to-lot). Subsequently, the linewidths of the isolated and non-isolated features in each region are measured.

According to the present invention, it is advantageous to calibrate the process prior to forming structures by identifying the best focus ($f_B$, that is, f=0) of the lithographic printing system which corresponds to the "peak" or maximum of the linewidth/focus curve. This focus can be identified in a variety of ways; for example, by a previous calibration of the lithographic printing tool or by plotting the measured linewidths at various focus settings to generate a curve similar to FIG. 5 and identifying the focus setting which corresponds to the peak in the FIG. 5 linewidth/focus curve. Of course, the ISO/DENSE bias curve of FIG. 6 may also be used for such purposes and the best focus corresponds to the focus setting at which the linewidth variation between differing features is at a minimum. Any manner of calibrating the process by identifying the best focus is contemplated as falling within the scope of the present invention.

Once the best focus (f=0) has been established for the printing tool and the structures (isolated and non-isolated) have been formed and measured, and the ISO/DENSE bias associated therewith is known, one can determine the extent to which the focus has varied from the best focus at the various regions at which the isolated and non-isolated structures have been formed. The determination preferably proceeds in the following manner.

Initially, the functional dependence of isolated and non-isolated features must be established with respect to both focus and dose for the particular lithographic printing tool being used. The functional dependence of these variables (focus and dose) may be determined upon a characterization of the printing tool and such a characterization may occur as follows. For formation of both isolated and dense features, the focus of the printing tool is intentionally varied in a controlled manner and the linewidths of the resulting isolated and dense features are plotted over focus as shown, for example, in FIG. 8. Similarly, isolated and dense features are formed while the illumination dose of the printing tool is intentionally varied in a controlled manner and the resulting feature linewidths are plotted over dose as shown, for example, in FIG. 9.

Figure 8:
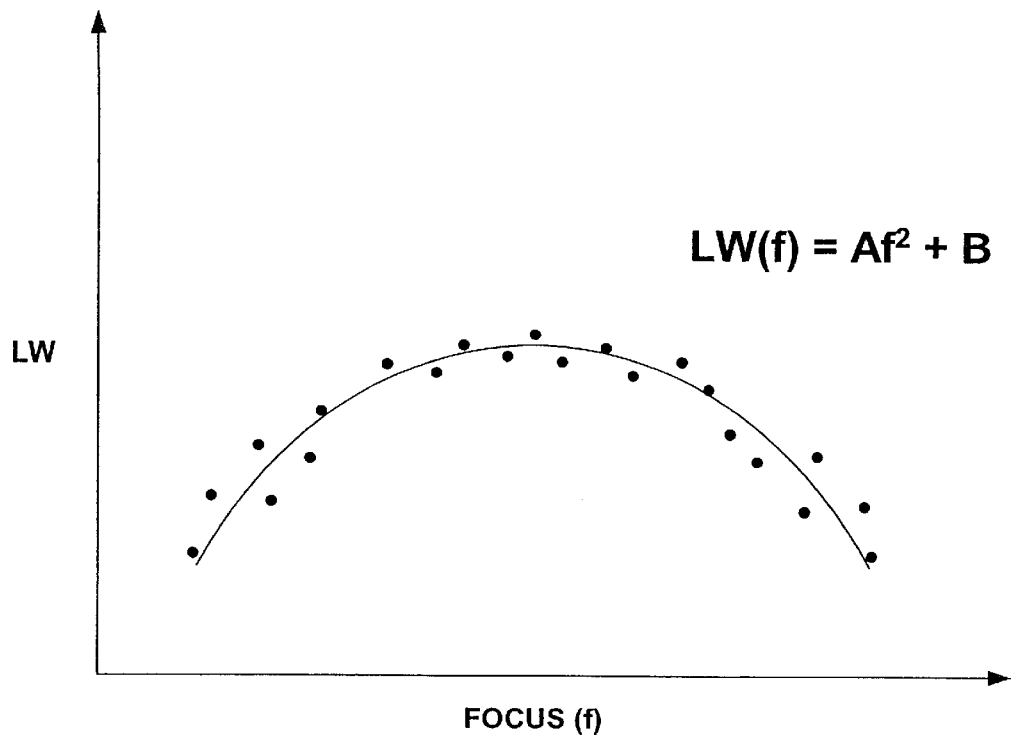
FIG. 8 is a graph of plotted points corresponding to similar structures formed over varying focus conditions for use in characterizing the lithographic printing tool according to the present invention.
Figure 9:
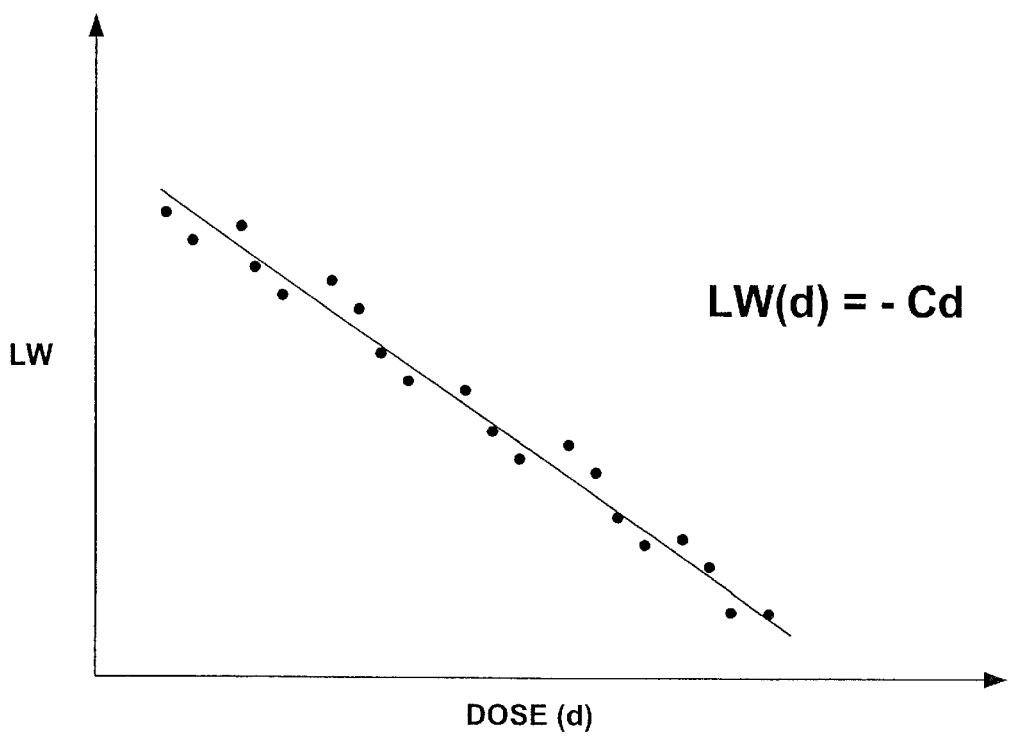
FIG. 9 is a graph of plotted points corresponding to similar structures formed over varying dose conditions for use in characterizing the lithography printing tool according to the present invention.

Once the linewidth of the features are separately plotted over focus and dose, respectively, a curve-fitting technique is employed to identify a curve which satisfies the plotted data (isolated features and dense features over both focus and dose). As seen in FIG. 8, the linewidth dependence on focus (f) for both isolated and non-isolated or dense features is generally a parabolic function which can be represented by:

$$\text{linewidth}(f) = Af^2 + B,$$

wherein A and B are constants that are calculated in the curve-fitting which accurately characterize the plotted data for the printing tool. Similarly, as seen in FIG. 9, the linewidth dependent on dose (d) is a generally linear function which can be represented by:

$$\text{linewidth}(d) = -Cd,$$

wherein C represents the slope of the linear function. Since the curve-fitting takes place for both isolated and dense features, the characterization constants for all the plotted data is as follows:

$$\text{linewidth}_{iso}(f) = Af^2 + B,$$

$$\text{linewidth}_{iso}(d) = -Cd,$$

$$\text{linewidth}_{dense}(f) = Df^2 + E,$$

and $$\text{linewidth}_{dense}(f) = -Fd,$$

wherein the constants A, B, C, D, E and F are all known via the curve-fitting technique and uniquely characterize the lithographic printing tool being used.

It is known that the following functions model the behavior of linewidth for isolated and dense features over changes in focus and dose, respectively, as follows:

$$\text{linewidth}_{iso} = Af^2 + B + Cd,$$

$$\text{linewidth}_{dense} = Df^2 + E + Fd,$$

wherein A, B, C, D, E and F are the characterization constants of the printing tool which were determined above. Using the above two equations, one can solve for the two unknowns $f^2$ and d, wherein f is the change in focus from the best focus and d is the change in dose from the best dose at the point of interest. The solution may proceed as follows:

$$\begin{bmatrix} A & C \\ D & F \end{bmatrix} \begin{bmatrix} f^2 \\ d \end{bmatrix} = \begin{bmatrix} \text{linewidth}_{iso} - B \\ \text{linewidth}_{dense} - E \end{bmatrix}$$

Therefore, the solution for $f^2$ and d is as follows:

$$\begin{bmatrix} f^2 \\ d \end{bmatrix} = \begin{bmatrix} A & C \\ D & F \end{bmatrix}^{-1} \begin{bmatrix} linewidth_{iso} - B \\ linewidth_{dense} - E \end{bmatrix}$$

Consequently, by solving the above equations, one can determine the change in focus and dose at one point in the image field. In addition, by moving to another portion of the wafer corresponding to the same point in the image field (e.g., $X_1$, $Y_1$ as the stepper steps across the wafer), the change in focus and dose can be determined similarly. Consequently, with such information about changes in focus and dose from their optimum values, one can also determine the variation in focus and dose from point to corresponding point across the wafer, from wafer-to-wafer, from lot-to-lot or generally over time, as may be desired. Note that the equations above highlight one exemplary embodiment in which isolated and non-isolated features are used. Alternatively, any features having differing pitches may be used and are contemplated as falling within the scope of the present invention.

The use of the isolated and non-isolated or dense structures to evaluate the lithographic printing process can be used in conjunction with a test wafer in which many such structures are fabricated at locations corresponding to different points in the image field. Alternatively, however, and more preferably, the method of the present invention is utilized in conjunction with a standard, semiconductor manufacturing process. Accordingly, the isolated and non-isolated features are formed in a preferred embodiment of the invention in one or more scribe lines between the various die on a substrate (typically a semiconductor wafer).

Figure 10:
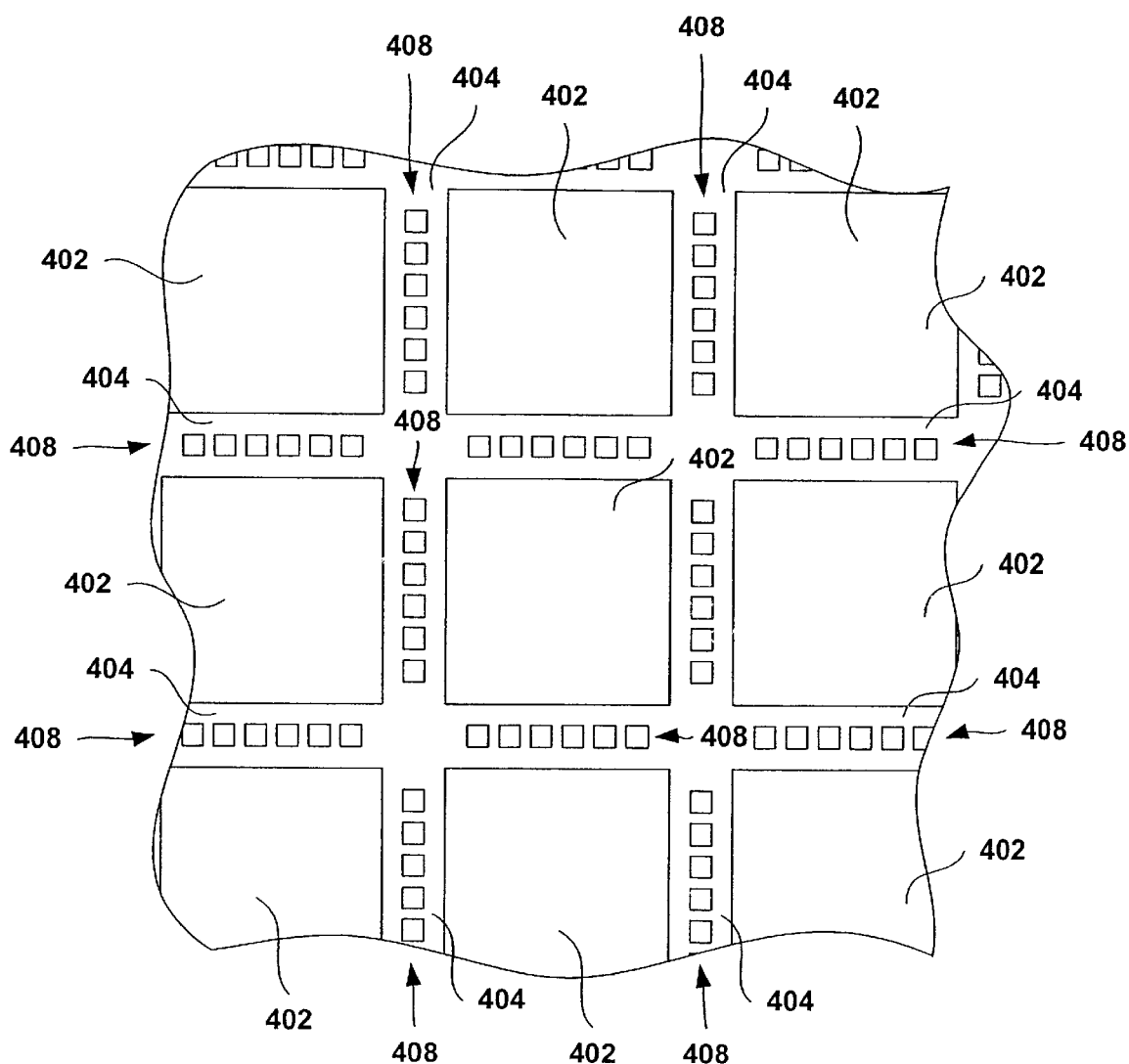
FIG. 10 is a plan view illustrating a plurality of die in a portion of an image field, with a plurality of test structures formed in the scribe lines between the die, wherein the test structures in the scribe lines are used to separate focus-induced linewidth variations from dose-induced linewidth variations across the image field according to the present invention.

One exemplary manner in which isolated and non-isolated structures are fabricated for evaluative purposes without interfering with the normal semiconductor manufacturing process is illustrated in FIG. 10. FIG. 10 illustrates a region 400 generally corresponding to a portion of an image field of a lithographic printing tool (i.e., a stepper having an image field that includes a plurality of die). The image field according to the preferred embodiment includes multiple die 402 having scribe lines 404 therebetween. The scribe lines 404 typically contain alignment marks, etc., and after semiconductor processing or other type processing serve as the locations for a cutting tool which is used to cut the wafer into individual die for subsequent individual attachment to a lead frame, etc.

According to an exemplary embodiment of the present invention, the isolated and non-isolated features 408 are formed in the scribe lines 404 between the die 402. Preferably, a plurality of features 408, each being similar to region 300 of FIGS. 7a or 7b, are formed within each scribe line and each generally correspond to a single point (e.g., $X_1$, $Y_1$;, $X_2$, $Y_2$; ... $X_n$, $Y_n$) in the image field. (Note that FIG. 10 may not be drawn to scale, but rather is provided for ease of illustration purposes). In the above manner, the features 408 do not interfere with the formation of structures/devices/circuits, etc. within the die 402. Consequently, the features 408 can be used in conjunction with an in-line semiconductor manufacturing process monitor.

Figure 11:
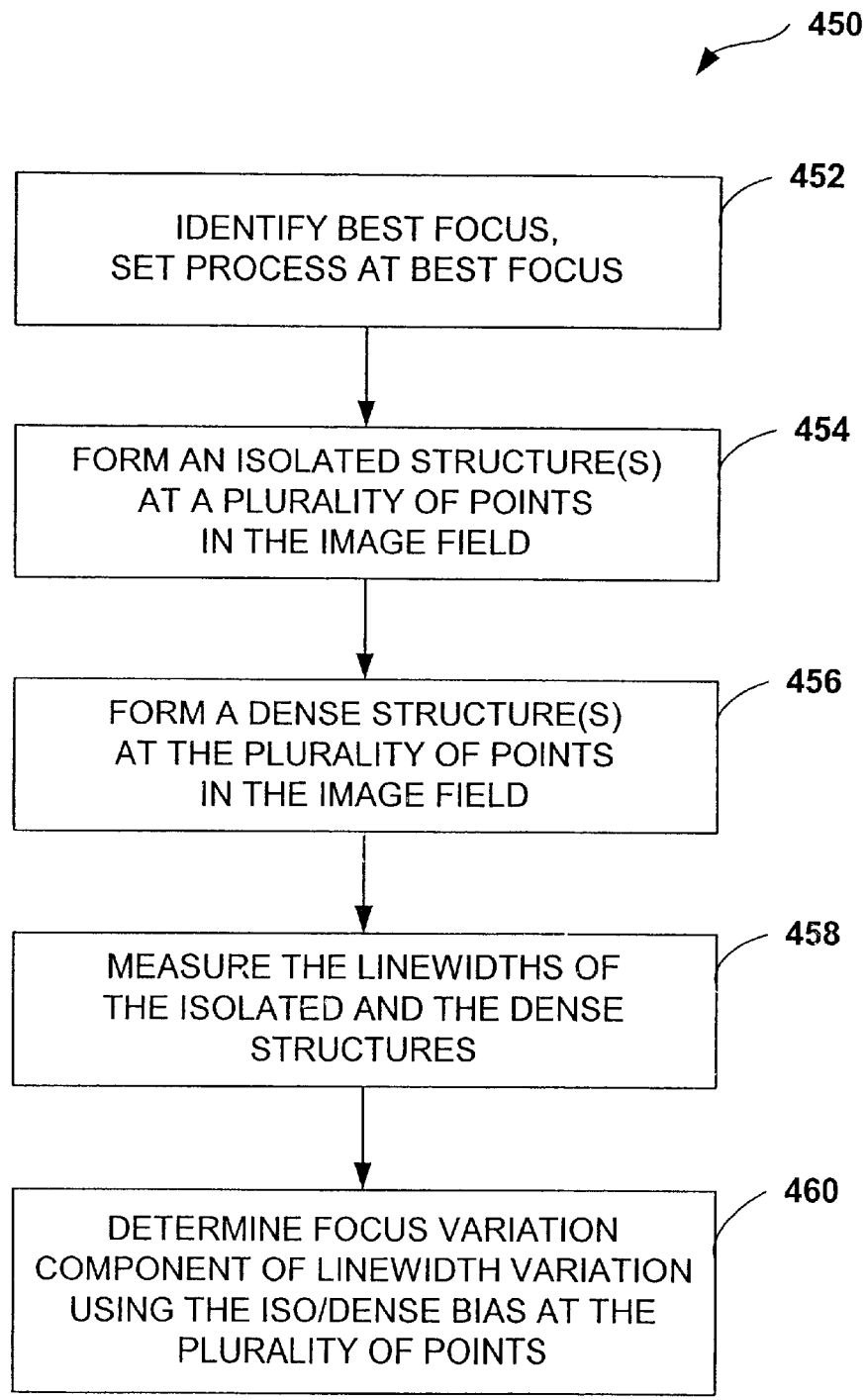
FIG. 11 is a flow chart diagram illustrating a method of separating focus-induced feature linewidth variations from dose-induced feature linewidth variations according to the present invention.

As discussed above in conjunction with FIGS. 4–10, features having differing pitches (e.g., isolated and non-isolated features) are used to identify the extent to which linewidth variations across the image field are due to focus-induced variations and dose-induced variations, respectively. A method flowchart for achieving the above objective is illustrated in FIG. 11 and designated at reference numeral 450. The process 450 preferably begins at step 452, wherein the best focus for the lithographic printing tool is identified and used for subsequent processing. As described supra, the best focus can be determined in a variety of ways, for example, by previously characterizing the lithographic printing tool.

The method 450 continues at step 454 by forming an isolated type structure at one or more points in the image field according to any one of various conventional processing techniques. For example, according to a preferred embodiment of the present invention, the isolated structures are formed in various locations within the scribe lines of various die when multiple die reside within the image field of the lithographic printing tool. Similarly, a dense feature is formed at the one or more locations where the isolated features are formed at step 456. Preferably, steps 454 and 456 are performed simultaneously through the same manufacturing steps and in conjunction with the standard processing steps used to manufacture the structures, devices and circuits within the various die.

Once the isolated and non-isolated features have been fabricated at steps 454 and 456, the linewidths of the isolated and non-isolated structures are measured at step 458, for example, by using an electrical linewidth measuring (ELM) technique. Alternatively, however, any manner of measuring the linewidths of the isolated and non-isolated structures may be used and is contemplated as falling within the scope of the present invention. Subsequently, the method 450 continues by determining the change in focus and dose from the best focus and dose at each of the various locations at which the structures were formed at step 460.

The above method provides an indication of the amount of change in focus and dose that occurred between a point and the best focus and best dose, respectively. However, because the solution for focus involves a squared term ($f^2$), the above solution identifies the amount of focus drift, but does not provide the direction of such shift (i.e., drift in the positive direction from the best focus or in the negative direction from best focus). According to an alternative embodiment of the present invention, the magnitude and direction of the focus shift for a point can be identified using a third test feature at each point of interest in the following manner.

Figure 12A:
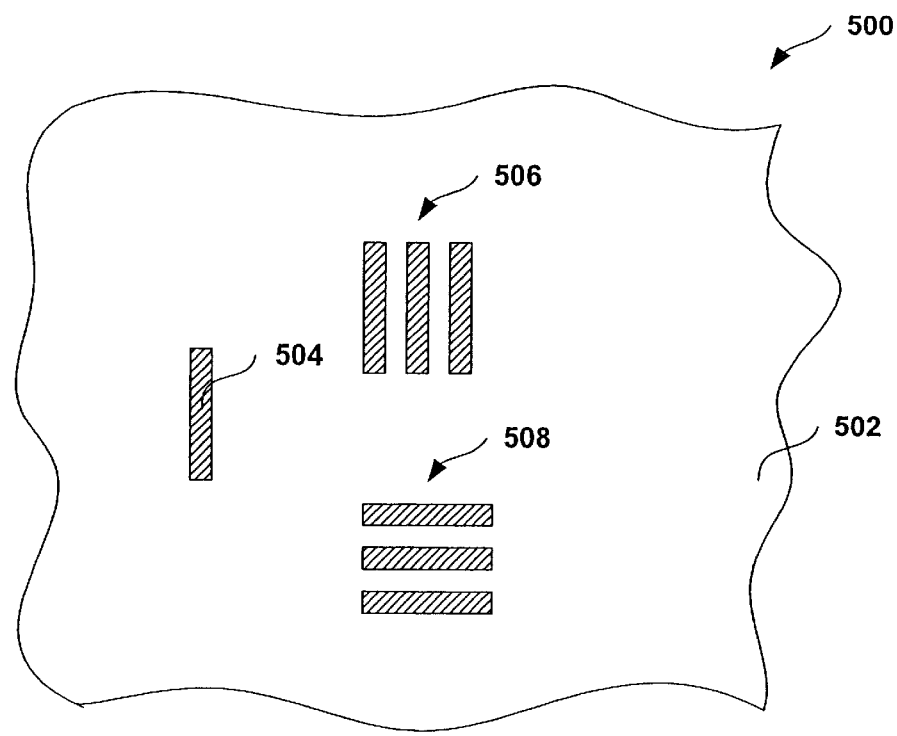
FIG. 12a is a fragmentary plan view illustrating a plurality of features, wherein at least two of the features have different pitches and at least two of the features have different orientations, according to the present invention.
Figure 12B:
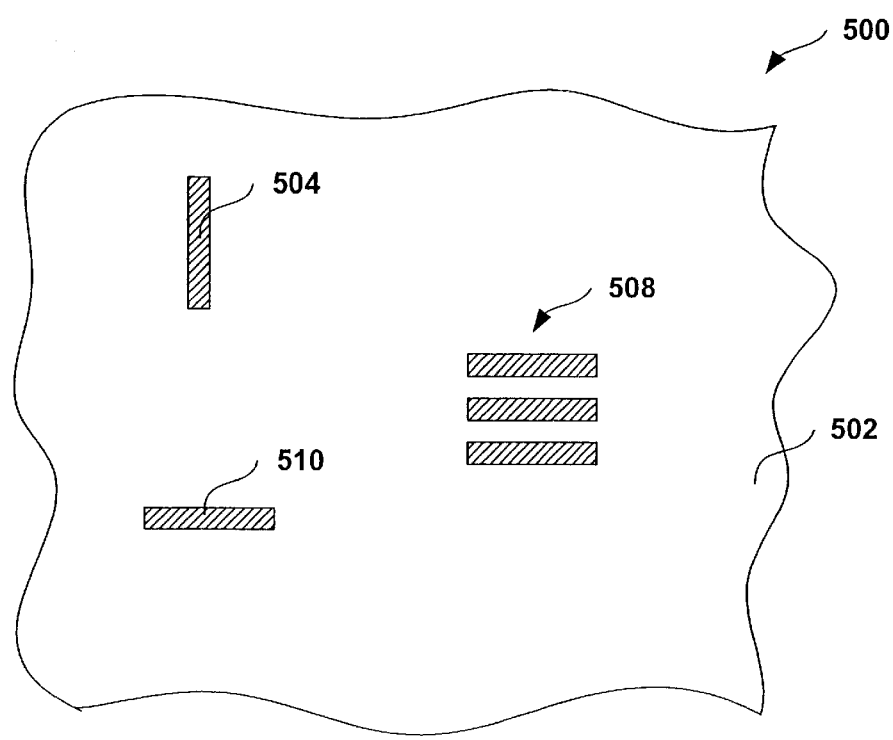
FIG. 12b is a fragmentary plan view illustrating a plurality of features, wherein at least two of the features have different pitches and at least two of the features have different orientations, according to the present invention.

For an optical system employed in a lithographic system having astigmatism, the focus differs between vertical-type features and horizontal-type features. Since most optical systems used in lithography printing tools have some non-negligible astigmatism, the present invention can determine both the magnitude and direction of the focus variation between a point and the best focus. Structures for performing such a function are illustrated in FIGS. 12a and 12b. In FIG. 12a, a region 500 on a substrate 502 (which corresponds generally to a point within the image field of the lithographic printing tool) has an isolated structure 504, a vertical dense structure 506 and a horizontal dense structure 508. Alternatively, a test structure such as in FIG. 12b may be used in which the region 500 includes the vertical isolated feature 504 and the horizontal dense feature 508 (alternatively may use feature 506) and an isolated horizontal feature 510. Again, isolated and non-isolated features are discussed in conjunction with an exemplary embodiment of the invention. It should be understood, however, that any features having differing pitches may be used and are contemplated as falling within the scope of the present invention.

A plurality of structures such as those illustrated in FIG. 12a or 12b are formed across the wafer at points which correspond to the same region 500 in the image field. The linewidths of all the features are then measured and the direction in the change of focus between a point and the best focus is determined in conjunction with FIGS. 13a and 13b.

Figure 13A:
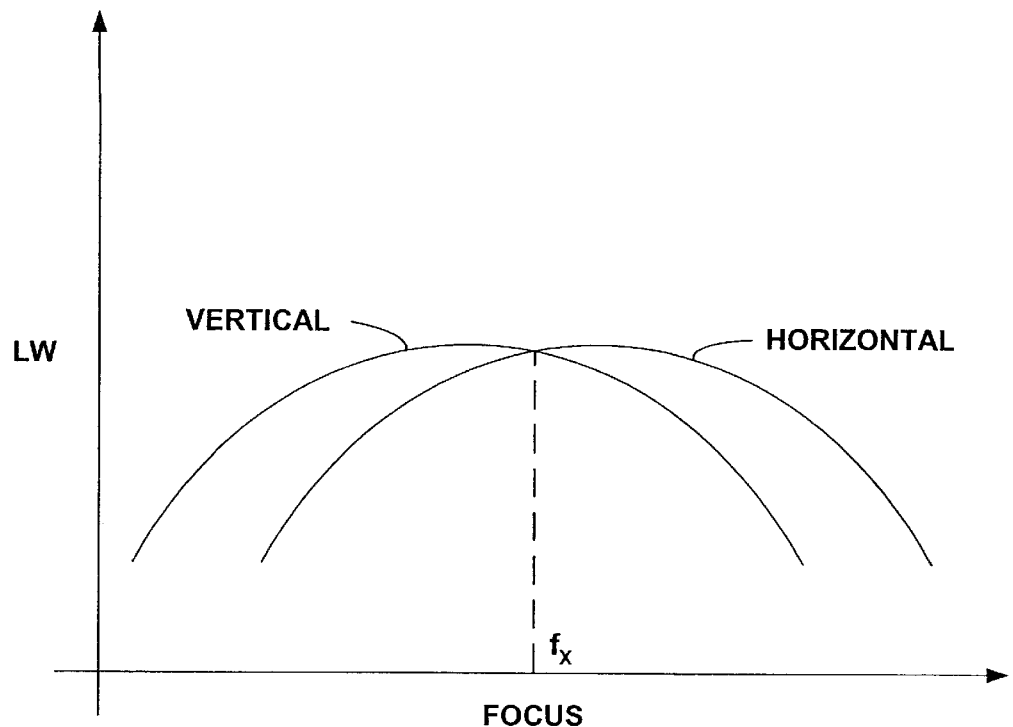
FIG. 13a is a graph illustrating how a linewidth of a feature varies over focus and how astigmatism causes such variations to be unique for horizontal and vertical feature orientations.
Figure 13B:
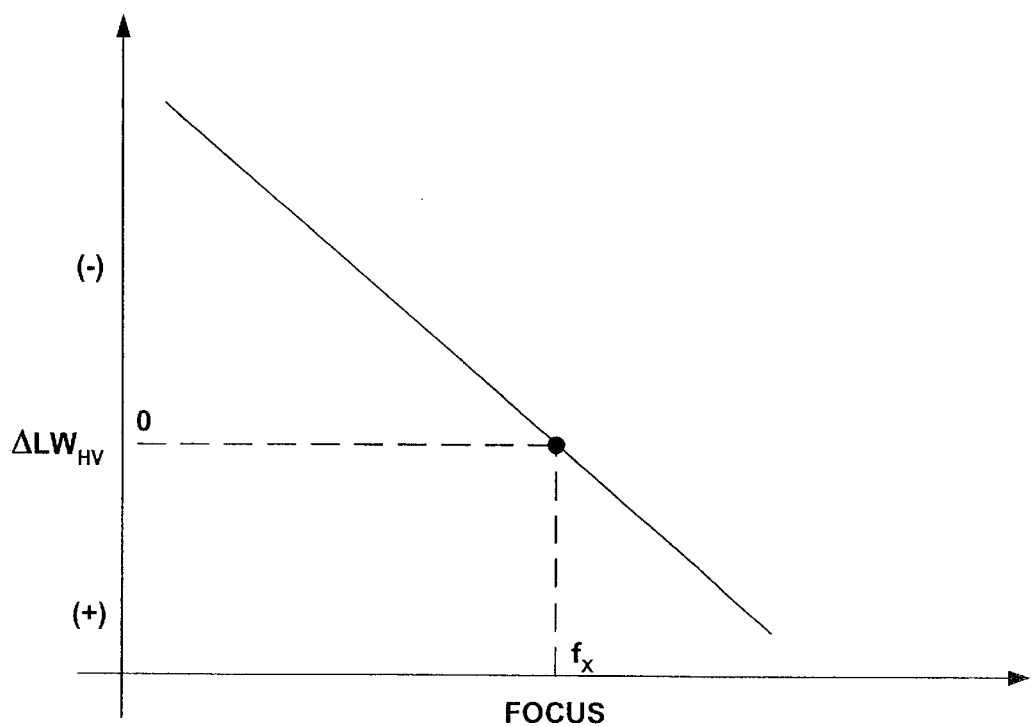
FIG. 13b is a graph illustrating how the linewidth difference between horizontal and vertical features of the same pitch vary over changes in focus.

FIG. 13a is a graph which illustrates how astigmatism in an optical system of the lithography printing tool impacts the manner in which horizontal and vertical features vary with respect to focus. In particular, as focus varies, the linewidth changes or variations for vertical features differ from that of horizontal features (whether the features are isolated or dense). A graph illustrating such variation is illustrated in FIG. 13b which shows how the horizontal/vertical bias varies from positive to negative about a best focus point (f=0). Consequently, once the change in focus and dose is calculated in a manner as discussed supra, the direction in the change of focus can be determined by calculating the horizontal/vertical bias (i.e., a dense bias if the structure of FIG. 12a is used or an isolated bias if the structure of FIG. 12b is used). Therefore, as illustrated in FIGS. 13a and 13b, if the horizontal/vertical bias is positive, the focus change varied in the positive direction from the best focus and if the horizontal/vertical bias is negative, the focus change varied in the negative direction. Therefore according to the present invention, the inclusion of horizontal and vertical test structures for optical systems having astigmatism allows for the determination of both the amount and direction of focus variation as well as a determination of the amount of variation in illumination dose.

Although the invention has been shown and described with respect to a certain preferred embodiment or embodiments, it is evident that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of identifying a change in focus and a change in illumination at a region on a substrate corresponding to a point in an image field of a lithographic printing tool from a best focus and a best dose, comprising the steps of:

forming a substantially isolated feature and a substantially non-isolated feature at the region on the substrate;

identifying a linewidth of the substantially isolated feature and the substantially non-isolated feature; and using the identified linewidth of the substantially isolated feature and the substantially non-isolated feature to determine the change in focus from the best focus and the change in dose from the best dose which would produce both the substantially isolated feature and the substantially non-isolated feature at the region.

2. The method of claim 1, wherein identifying a linewidth of the substantially isolated feature and the substantially non-isolated feature comprises measuring the linewidths, respectively.

3. The method of claim 2, wherein measuring the linewidths comprises performing an electrical linewidth measurement on the substantially isolated feature and the substantially non-isolated feature.

4. The method of claim 2, wherein measuring the linewidths comprises scanning the features with a scanning electron microscope.

5. The method of claim 1, wherein the substantially isolated feature is a sufficient distance from a neighboring feature such that the neighboring feature has substantially no effect on a processing of the substantially isolated feature.

6. The method of claim 1, wherein the substantially non-isolated feature comprises a feature having a neighboring feature with a distance therebetween which is sufficiently small such that the neighboring feature has an effect on a processing of the substantially non-isolated feature.

7. A method of identifying a change in focus and a change in illumination at a region on a substrate corresponding to a point in an image field of a lithographic printing tool from a best focus and a best dose, comprising the steps of:

forming a feature having a first pitch and a feature having a second pitch at the region on the substrate, wherein the first pitch and the second pitch are different;

identifying a linewidth of the first pitch feature and the second pitch feature; and using the identified linewidth of the first pitch feature and the second pitch feature to determine the change in focus from the best focus and the change in dose from the best dose which would produce both the first pitch feature and the second pitch feature at the region.

8. The method of claim 7, wherein the first pitch feature is a substantially isolated feature and the second pitch feature is a substantially non-isolated feature.

9. The method of claim 7, wherein using the identified linewidths to determine the change in focus and dose comprises the steps of:

using the identified linewidth of the first pitch feature to set up an equation which describes a behavior of the first pitch feature linewidth over variations in focus and dose;

using the identified linewidth of the second pitch feature to set up an equation which describes a behavior of the second pitch feature linewidth over variations in focus and dose; and solving the first pitch feature equation and the second pitch feature equation together to identify the change in focus and the change in dose.

10. The method of claim 9, further comprising the step of characterizing the lithographic printing tool to identify equation constants which characterize the behavior of the first pitch feature and the second pitch feature over variations in focus and variations in dose.

11. The method of claim 10, wherein the step of characterizing the lithographic printing tool to identify the equation constants comprises:

forming a plurality of first pitch features and a plurality of second pitch features, wherein each of the first pitch features and the second pitch features are formed at a different focus;

measuring the linewidth of each of the plurality of first pitch features and the second pitch features;

plotting the linewidths of the first pitch features over focus;

plotting the linewidths of the second pitch features over focus;

identifying curves which substantially fit the plotted linewidth over focus plots; and determining the equation constants using the curves.

12. The method of claim 10, wherein the step of characterizing the lithographic printing tool to identify the equation constants comprises:

forming a plurality of first pitch features and a plurality of second pitch features, wherein each of the first pitch features and the second pitch features are formed at a different dose;

measuring the linewidth of each of the plurality of first pitch features and the second pitch features;

plotting the linewidths of the first pitch features over dose;

plotting the linewidths of the second pitch features over dose;

identifying curves which substantially fit the plotted linewidth over dose plots; and determining the equation constants using the curves.

13. A method of determining a change in focus and a change in illumination dose at a region of a substrate corresponding to a point in an image field of a lithographic printing tool from a best focus and a best dose, comprising the steps of:

forming a feature having a first orientation and a first pitch at the region on the substrate;

forming a pair of features having a second pitch, wherein one of the features having the second pitch has a second orientation and the other of the features having the second pitch has a third orientation, and wherein the second orientation and the third orientation are perpendicular to one another;

identifying a linewidth of the first orientation feature, the second orientation feature and the third orientation feature;

using the identified linewidth of the first orientation feature having the first pitch and one or both of the identified linewidths of the second and third orientation features having the second pitch to determine the change in focus from the best focus and the change in illumination dose from the best dose which would produce the features at the region; and using the second and third orientation features having the second pitch to determine a direction of the change in focus from the best focus.

14. The method of claim 13, wherein using the second and third orientation features having the second pitch to determine a direction of change in focus comprises:

subtracting one of the second and third orientation feature linewidths from the other of the second and third feature linewidths, thereby providing a result which is a difference between the feature linewidths;

determining whether the result is positive or negative; and determining the direction of the change in focus from the best focus using the determination whether the result is positive or negative.

15. The method of claim 13, wherein the second orientation is a generally vertical orientation and the third orientation is a generally horizontal orientation.

16. The method of claim 13, wherein the first orientation and the second orientation are substantially the same.

17. The method of claim 13, wherein the first orientation and the third orientation are substantially the same.

18. The method of claim 13, wherein the second pitch is greater than the first pitch.

19. The method of claim 13, wherein the second pitch is less than the first pitch.

20. The method of claim 13, further comprising the step of characterizing the lithographic printing tool to identify the best focus and best illumination dose associated therewith.

21. The method of claim 13, wherein using the identified linewidth of the first orientation feature having the first pitch and one or both of the second and third orientation features having the second pitch to determine the change in focus and dose comprises the steps of:

using the identified linewidths of the first orientation feature having the first pitch to set up an equation which describes a behavior of the first orientation feature having the first pitch over variations in focus and dose;

using the identified linewidths of one or both of the second and third orientation features having the second pitch to set up an equation which describes a behavior of a feature having the second pitch over variations in focus and dose; and solving the first pitch equation and the second pitch equation together to identify the change in focus and the change in dose.

22. The method of claim 21, wherein using the identified linewidths of both the second and third orientation features having the second pitch comprises calculating an average linewidth using the second and third orientation features using the average linewidth to set up the second pitch equation.

* * * * *

UNITED STATES PATENT AND TRADEMARK OFFICE
CERTIFICATE OF CORRECTION

PATENT NO. : 6,414,326 B1  Page 1 of 1
DATED : July 2, 2002
INVENTOR(S) : Khanh B. Nguyen It is certified that error appears in the above-identified patent and that said Letters Patent is hereby corrected as shown below:

<u>Column 7,</u>
Line 3, please replace the formula "$\Delta |LW_1\text{-}LW_2|$" with the formula
-- $\Delta = |LW_1 - LW_2|$ --.

Signed and Sealed this

Twenty-ninth Day of October, 2002

*Attest:*

JAMES E. ROGAN
*Attesting Officer*  *Director of the United States Patent and Trademark Office*